United States Patent
Hoefler et al.

(10) Patent No.: US 7,444,557 B2
(45) Date of Patent: Oct. 28, 2008

(54) MEMORY WITH FAULT TOLERANT REFERENCE CIRCUITRY

(75) Inventors: Alexander B. Hoefler, Austin, TX (US); Qadeer A. Qureshi, Dripping Springs, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 835 days.

(21) Appl. No.: 10/891,649

(22) Filed: Jul. 15, 2004

(65) Prior Publication Data

US 2006/0039215 A1    Feb. 23, 2006

(51) Int. Cl.
*G11C 29/24* (2006.01)
*G11C 29/40* (2006.01)

(52) U.S. Cl. ................ 714/710; 714/718

(58) Field of Classification Search .......... 714/710, 714/718, 25, 42, 54, 702, 719, 763; 365/200, 365/201
See application file for complete search history.

(56) References Cited

U.S. PATENT DOCUMENTS

| | | | | |
|---|---|---|---|---|
| 5,650,971 A | * | 7/1997 | Longway et al. | ............ 365/207 |
| 5,959,922 A | * | 9/1999 | Jung | ............ 365/210 |
| 5,986,919 A | * | 11/1999 | Allen et al. | ............ 365/145 |
| 6,258,700 B1 | | 7/2001 | Bohr et al. | |
| 6,368,902 B1 | | 4/2002 | Kothandaraman et al. | |
| 6,441,676 B1 | | 8/2002 | Koehl et al. | |
| 6,465,282 B1 | * | 10/2002 | Tobben et al. | ............ 438/131 |
| 6,687,150 B1 | * | 2/2004 | Joachim et al. | ............ 365/145 |
| 6,947,322 B2 | * | 9/2005 | Anzai et al. | ............ 365/185.03 |

* cited by examiner

*Primary Examiner*—Rehana Perveen
*Assistant Examiner*—Dipakkumar Gandhi
(74) *Attorney, Agent, or Firm*—James L. Clingan, Jr.; Robert L. King

(57) ABSTRACT

A memory not only uses redundant cells but also redundant references to reduce the likelihood of a failure. In one approach a failure in a reference can cause both the primary cell as well as the redundant cell to be ineffective. To overcome this potential problem two references for each bit are employed. In one form, the primary cell of a first bit is compared to one reference and the redundant cell of the first bit is compared to another reference. The primary and redundant cell of a second bit can use these two references as well. In another aspect, two references are placed in parallel for both the primary and redundant cell of the bit.

20 Claims, 2 Drawing Sheets

MEMORY WITH FAULT TOLERANT REFERENCE CIRCUITRY

FIELD OF THE INVENTION

This invention relates to memory circuits, and more particularly, to memory circuits that use a reference.

RELATED ART

Memories have taken a variety of forms based on the particular usage. In embedded applications which have a large logic component, the memory and the logic may require different processes and thus increase costs. This is worthwhile if the memory needs to be quite large. In such case the benefits of the memory are worth the extra cost of the additional processing. Even in such cases, it would be beneficial if the processes were not extra to that required for the logic. There are a number of applications where the memory size requirement is relatively small but more than just a few bits, and this memory function is critical. In such cases it is important that the memory be very reliable while not requiring any extra processing. Some memories are known that do not require extra processing, but they tend to not be as reliable.

Thus, there is a need for a memory that overcomes or improves on the requirements and shortcomings described above.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

A memory not only uses redundant cells but also redundant references to reduce the likelihood of a failure. In one approach a failure in a reference can cause both the primary cell as well as the redundant cell to be ineffective. To overcome this potential problem two references for each bit are employed. In one form, the primary cell of a first bit is compared to one reference and the redundant cell of the first bit is compared to another reference. The primary and redundant cell of a second bit can use these two references as well. In another aspect, two references are placed in parallel for both the primary and redundant cell of the bit. This is better understood by reference to the FIGs. and the following description.

Figure 1:
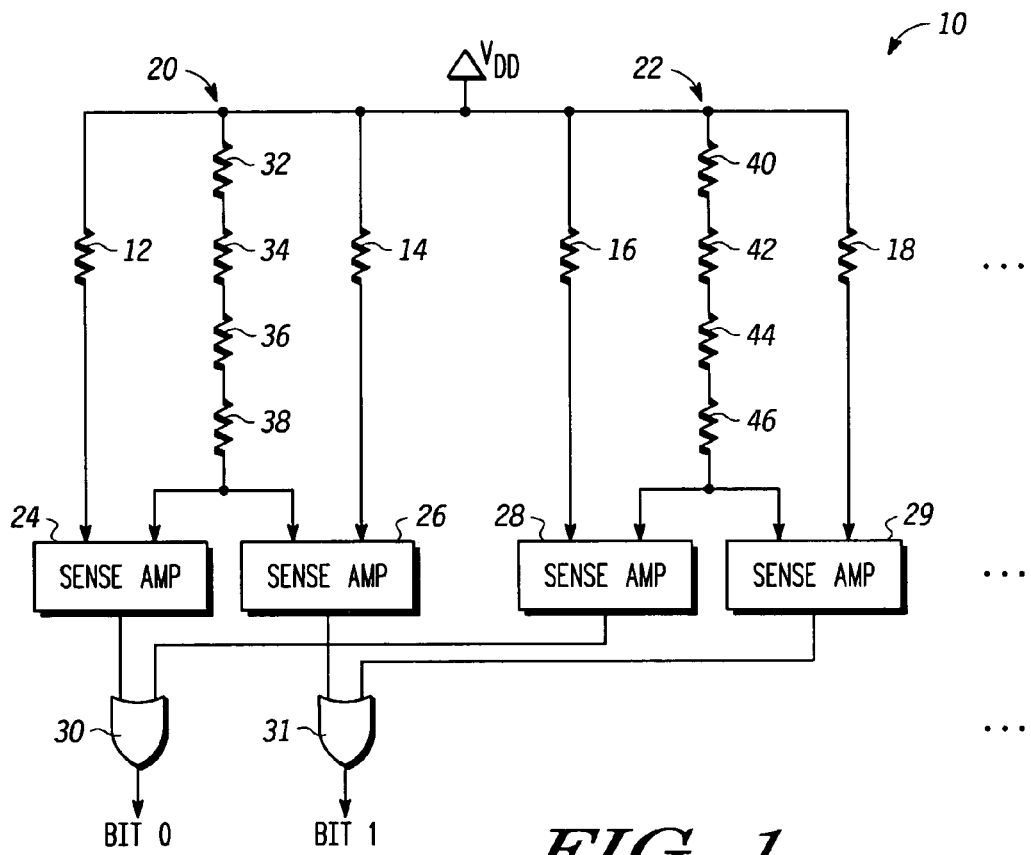
FIG. 1 is a circuit diagram of a circuit according to a first embodiment of the invention.

Shown in FIG. 1 is a memory 10 comprising a primary cell 12, a primary cell 14, a redundant cell 16, a redundant cell 18, a reference 20, a reference 22, a sense amplifier (sense amp) 24, a sense amp 26, a sense amp 28, a sense amp 29, an OR gate 30, and an OR gate 31. Reference 20 comprises reference cells 32, 34, 36, and 38. Reference 22 comprises reference cells 40, 42, 44, and 46.

Figure 2:
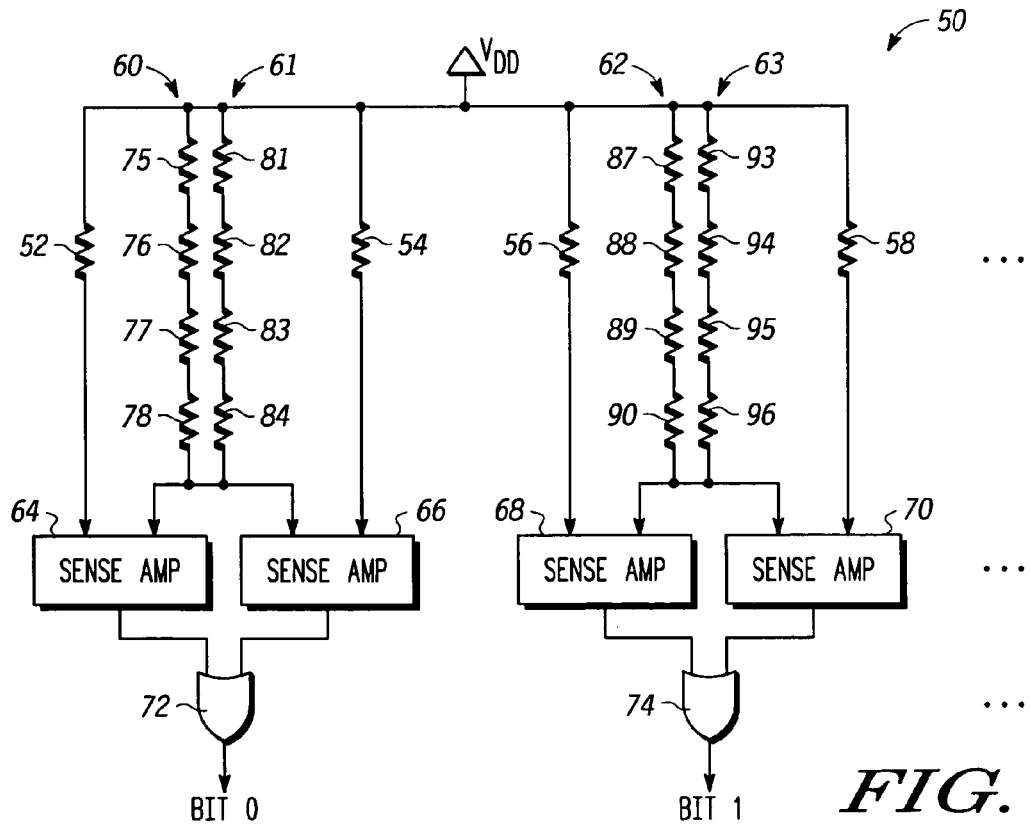
FIG. 2 is a circuit diagram of a circuit according to a second embodiment of the invention.
Figure 3:
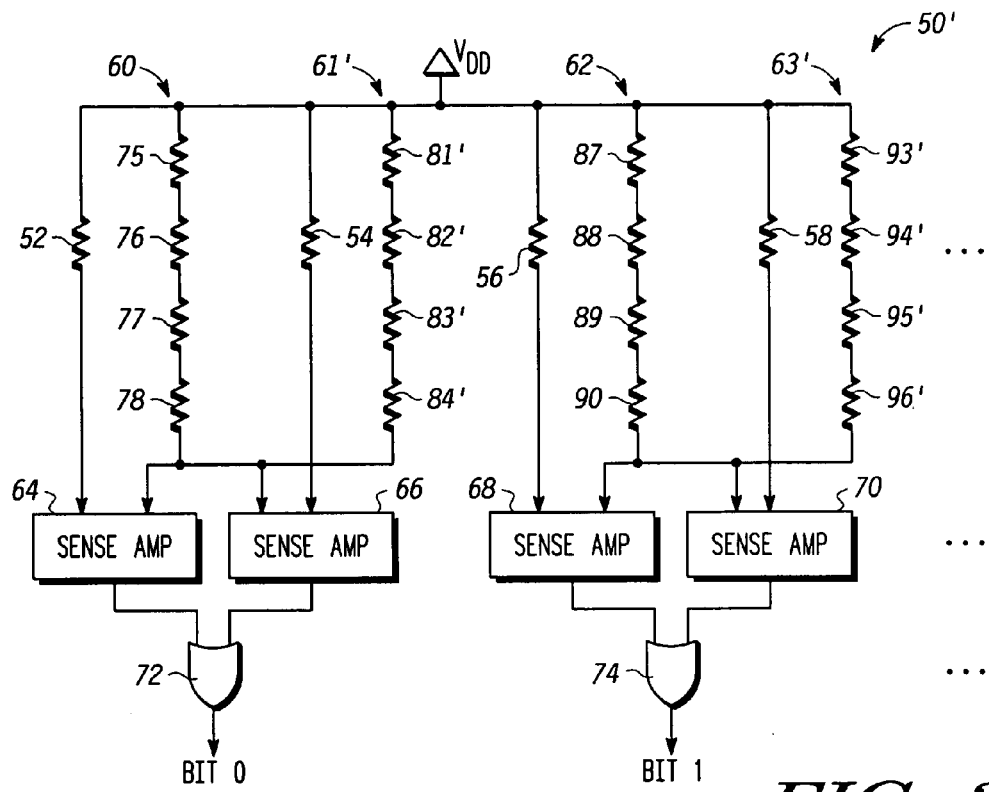
FIG. 3 is a circuit diagram of a circuit according to a third embodiment of the invention.

Primary cell 12 has a first terminal connected to a positive power supply terminal which is VDD in this case and a second terminal connected to a signal input of sense amp 24. Reference cell 32 has a first terminal connected to VDD and a second terminal. Reference cell 34 has a first terminal connected to the second terminal of reference cell 32 and a second terminal. Reference cell 36 has a first terminal connected to the second terminal of reference cell 34 and a second terminal. Reference cell 38 has a first terminal connected to the second terminal of reference cell 36 and a second terminal connected to a reference input of sense amplifier 24 and a reference input of sense amp 26. Primary cell 14 has a first terminal connected to VDD and a second terminal connected to a signal input of sense amp 26. In this example, memory 20 is showing being connected to VDD as a fixed power supply voltage. This connection terminal for memory 20 can be considered simply a voltage terminal that may receive a different voltage than VDD and such voltage can be controlled to provide a desired operation for memory 20 as well as other embodiments such as shown in FIGS. 2 and 3.

Primary cell 16 has a first terminal connected to VDD and a second terminal connected to a signal input of sense amp 28. Reference cell 40 has a first terminal connected to VDD and a second terminal. Reference cell 42 has a first terminal connected to the second terminal of reference cell 40 and a second terminal. Reference cell 44 has a first terminal connected to the second terminal of reference cell 42 and a second terminal. Reference cell 46 has a first terminal connected to the second terminal of reference cell 44 and a second terminal connected to a reference input of sense amplifier 28 and a reference input of sense amp 29. Primary cell 18 has a first terminal connected to VDD and a second terminal connected to a signal input of sense amp 29.

OR gate 30 has a first input connected to an output of sense amp 24, a second input connected an output of sense amp 28, and an output providing an output signal BIT 0. OR gate 31 has a first input connected to an output of sense amp 26, a second input connected an output of sense amp 31, and an output providing an output signal BIT 1. The memory bit that is represented by BIT 0 is made up of primary cell 12, redundant cell 16, and references 20 and 22. Similarly the memory bit that is represented by BIT 1 is made up of primary cell 14, redundant cell 18, and references 20 and 22.

Primary cells 12 and 14, redundant cells 16 and 18, and reference cells 32-38 and 40-46 are all resistive fuses. When in their unblown state, which is also called herein the unprogrammed state, they provide a resistance in the range of about 50 to 200 ohms. In the blown state, which is also called herein the programmed state, they can provide a resistance as low as one thousand ohms. These fuses are silicide capped polysilicon so that what is blown during programming is typically just the silicide cap leaving the polysilicon still in place. The presence or absence of the silicide provides a sufficient difference to establish detectible logic states. The use of silicide capped polysilicon as a memory cell and the described selective blowing thereof is well known in the art. Additional circuitry not shown is what actually blows these primary and redundant memory cells 12-18. Reference cells 32-38 and 40-46 are made the same way as the primary and redundant memory cells 12-18. This helps provide tracking with process variations.

As an example, BIT 0 is to be programmed to a logic high and BIT 1 is to be kept at a logic low. Primary cell 12 and primary cell 16 are attempted to be blown. After that, sense amps 24 and 26 compare the resistances of primary cells 12 and 14, respectively, to the resistance of reference 20, and sense amps 28 and 29 compare the resistances of primary cells 16 and 18, respectively, to the resistance of reference 22. This can be done either by establishing voltages or currents for comparison. If, after programming, BIT 0 is a logic high and BIT 1 is a logic low, then the operation was successful. This correct result can occur even if reference 20 was defective because it had a defective reference cell. Reference 20 in such case would actually have a higher resistance than primary cell 12 and the output of sense amp 24 would be a logic low. Sense amp 28, however, would provide a logic high output if reference 22 was not defective and redundant cell 16 was effectively programmed. In such case the resistance of redundant cell 16 would exceed that of reference 22, resulting in sense amp 28 providing a logic high output. OR gate receiving one logic high input and one logic low input would provide a logic high output, which is the desired result.

The correct result of BIT 0 being a logic high can also occur if one of primary cell 12 or redundant cell 16 is defective by failing to program. In the case of a failure to program, a cell remains low resistance. Thus if, for example, primary cell 12 fails to program and reference 20 is not defective, sense amp 24 will provide a logic low, which is the wrong result for a programmed cell. Sense amp 28, however, will provide a logic high output if redundant cell 16 programs properly and reference 22 is not defective. This logic high output of sense amp 28 will pass through OR gate 30 so that BIT 0 will be the correct result of a logic high. Although there is no correction for a situation in which the primary or redundant cell is defective at a high resistance, this is a defect that is present before programming thus can be detected prior to attempting any programming.

Shown in FIG. 2 is a memory 50 comprising a primary cell 52, a primary cell 54, a redundant cell 56, a redundant cell 58, a reference 60, a reference 62, a sense amplifier (sense amp) 64, a sense amp 66, a sense amp 68, a sense amp 70, an OR gate 72, and an OR gate 74. Reference 60 comprises reference cells 75, 76, 77, and 78. Reference 61 comprises reference cells 81, 82, 83, and 84. Reference 62 comprises 87, 88, 89, and 90. Reference 63 comprises 93, 94, 95, and 96.

Primary cell 52 has a first terminal connected to VDD and a second terminal connected to a signal input of sense amp 64. Reference cell 75 has a first terminal connected to VDD and a second terminal. Reference cell 76 has a first terminal connected to the second terminal of reference cell 75 and a second terminal. Reference cell 77 has a first terminal connected to the second terminal of reference cell 76 and a second terminal. Reference cell 78 has a first terminal connected to the second terminal of reference cell 77 and a second terminal connected to a reference input of sense amp 64 and a reference input of sense amp 66. Reference cell 81 has a first terminal connected to VDD and a second terminal. Reference cell 82 has a first terminal connected to the second terminal of reference cell 81 and a second terminal. Reference cell 83 has a first terminal connected to the second terminal of reference cell 82 and a second terminal. Reference cell 84 has a first terminal connected to the second terminal of reference cell 83 and a second terminal connected to the reference input of sense amp 64 and the reference input of sense amp 66. Primary cell 54 has a first terminal connected to VDD and a second terminal connected to a signal input of sense amp 66. In this example and as for memory 20, memory 50 is showing being connected to VDD as a fixed power supply voltage, but this is simply a voltage terminal that may receive a different voltage than VDD and such voltage can be controlled to provide a desired operation for memory 50.

Primary cell 56 has a first terminal connected to VDD and a second terminal connected to a signal input of sense amp 68. Reference cell 87 has a first terminal connected to VDD and a second terminal. Reference cell 88 has a first terminal connected to the second terminal of reference cell 87 and a second terminal. Reference cell 89 has a first terminal connected to the second terminal of reference cell 88 and a second terminal. Reference cell 90 has a first terminal connected to the second terminal of reference cell 89 and a second terminal connected to a reference input of sense amplifier 68 and a reference input of sense amp 70. Reference cell 93 has a first terminal connected to VDD and a second terminal. Reference cell 94 has a first terminal connected to the second terminal of reference cell 93 and a second terminal. Reference cell 95 has a first terminal connected to the second terminal of reference cell 94 and a second terminal. Reference cell 96 has a first terminal connected to the second terminal of reference cell 95 and a second terminal connected to a reference input of sense amplifier 68 and a reference input of sense amp 70. Primary cell 58 has a first terminal connected to VDD and a second terminal connected to a signal input of sense amp 70.

OR gate 72 has a first input connected to an output of sense amp 64, a second input connected an output of sense amp 66, and an output providing an output signal BIT 0. OR gate 74 has a first input connected to an output of sense amp 68, a second input connected an output of sense amp 70, and an output providing an output signal BIT 1. The memory bit that is represented by BIT 0 is made up of primary cell 52, redundant cell 54, and references 60 and 61. Similarly the memory bit that is represented by BIT 1 is made up of primary cell 56, redundant cell 58, and references 62 and 63.

In memory 50, each memory bit has a reference made up of two references in parallel; references 60 and 61 as the reference for providing BIT 0 and references 62 and 63 as the reference for providing BIT 1. Because, for cells that are not programmed, the failure mode is nearly always a high resistance, one of the two of cells for a bit can be defective without causing the whole reference to be defective. Thus, for example, if one of the cells in reference 60 is defective at a high resistance, reference 61 itself will provide a sufficiently low resistance to be lower than a programmed primary cell 52 or 54. Thus, sense amps 64 and 66 would still provide a logic high output for the case in which primary cells 52 and 54 are programmed. Similarly for references 62 and 63, one could have a defective reference cell that is at a high resistance and the other would provide the low enough resistance to provide the needed resistance differential to that of a programmed primary or redundant cell. Also, two references in parallel, with no defects, still provide a sufficiently high resistance to distinguish it from an unprogrammed primary or redundant cell.

Although the most common defect is a failure to program, which results in a low resistance for a programmed state, there are sufficient failures due to high resistance so that it causes a problem for references that have multiple (4 in this example) cells in series. Thus, in this embodiment BIT 0 can accurately show a logic high output even if one of references 60 or 61 has one or more defective reference cells and either but not both of cells 52 and 54 fail to program. As for memory 10, the uncorrectable failure is for the case in which either cell 52 or 54 is defective at the high resistance condition. This type of defect is detectible at test so can be prevented from being shipped to a user with the defect.

A memory 50' is shown in FIG. 3 which is connected the same electrically as memory 50 but has a different physical arrangement. The numerals of unchanged elements remain the same as in FIG. 2. References 61' and 63' replace references 61 and 63 with the same electrical connections but instead of being physically adjacent are separated by redundant cell 54. Multiple failures are more likely to occur close together so there is a benefit to separating the two references. The primary and redundant cells 52 and 54 are separated by reference 60 and primary and redundant cells 56 and 58 are separated by reference 62. Thus, the areas where two failures would cause an uncorrectable problem are separated by at least a cell.

Figure 4:
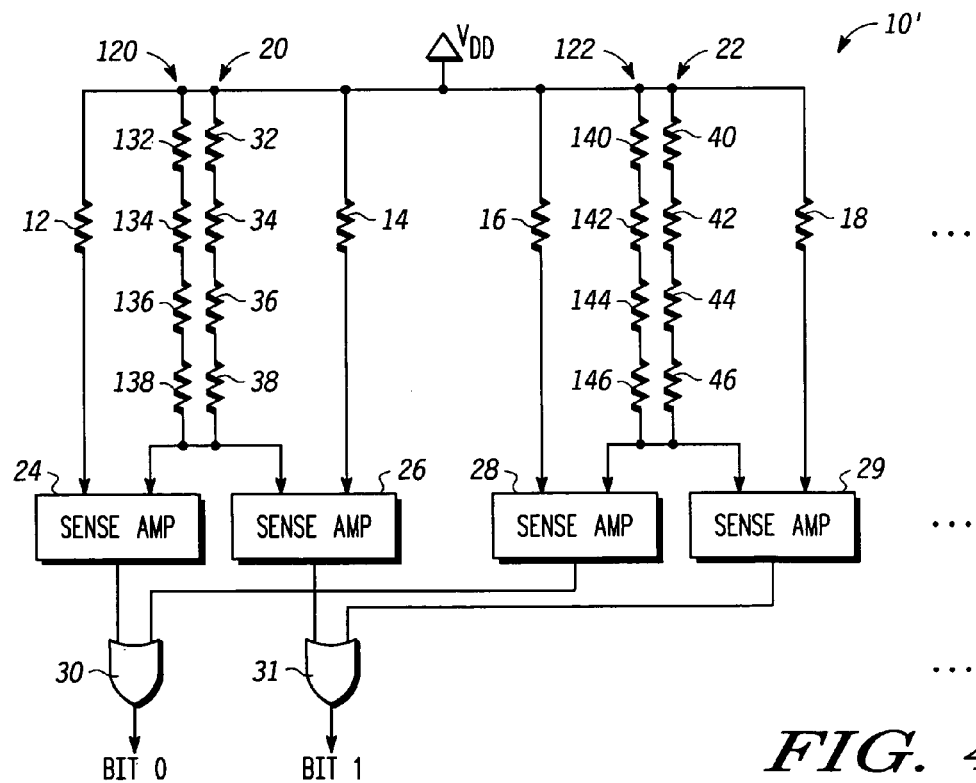
FIG. 4 is a circuit diagram of a circuit according to a fourth embodiment of the invention.

Shown in FIG. 4 is a memory 10' that is the same as memory 10 of FIG. 1 with the addition of references 120 and 122. The elements of memory 10 have retained their numerals. Reference 120 comprises reference cells 132, 134, 136, and 138. Reference 122 comprises reference cells 140, 142, 144, and 146. Reference cell 132 has a first terminal connected to VDD and a second terminal. Reference cell 134 has a first terminal connected to the second terminal of reference cell 132 and a second terminal. Reference cell 136 has a first terminal connected to the second terminal of reference cell 134 and a second terminal. Reference cell 138 has a first terminal connected to the second terminal of reference cell 36 and a second terminal connected to the reference input of sense amplifier 24 and the reference input of sense amp 26. Reference cell 140 has a first terminal connected to VDD and a second terminal. Reference cell 142 has a first terminal connected to the second terminal of reference cell 140 and a second terminal. Reference cell 144 has a first terminal connected to the second terminal of reference cell 142 and a second terminal. Reference cell 146 has a first terminal connected to the second terminal of reference cell 144 and a second terminal connected to the reference input of sense amplifier 28 and the reference input of sense amp 29.

The addition of references 120 and 122 add further reduction in the likelihood of a failure to properly program a memory bit. In the case of memory 10, a failure due to defective cells in the references would require both a defective cell in reference 20 and reference 22. For memory 10', defects in cells in four different references would be required to result in the inability to program a memory bit to a logic high. Further, references 120 and 122 could be moved in the manner that references 61' and 63' were moved in FIG. 3. Thus, instead of references 120 and 20 being adjacent as in FIG. 4, they would be separated as references 60 and 61' are separated in FIG. 3.

In the foregoing specification, the invention has been described with reference to specific embodiments. However, one of ordinary skill in the art appreciates that various modifications and changes can be made without departing from the scope of the present invention as set forth in the claims below. For example, the embodiments have been described using fuses as memory cells whereas another type of memory may also be used. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A memory comprising a plurality of bits, each bit comprising:
    a cell for being programmed to store either a logic one or a logic zero value;
    a reference element comprising one or more reference cells having an output for providing a reference value;
    a redundant cell for being programmed to store a same bit value as the cell;
    a redundant reference element comprising one or more reference cells having an output for providing a reference value;
    a first sense amplifier circuitry coupled to the cell and the output of the reference element, the sense amplifier circuitry having an output representative of either a current relationship or a voltage relationship between the cell and the reference element;
    a second sense amplifier circuitry coupled to the redundant cell and the output of the redundant reference element, the second sense amplifier representative of either a current relationship or a voltage relationship between the redundant cell and the redundant reference element;
    a logic circuit coupled to the output of the first sense amplifier circuitry and the output of the second sense amplifier circuitry, the logic circuit performing a logic operation on the outputs of the first and second sense amplifier circuitry and providing an output indicating a result of the logic operation as a logic state of the bit.

2. The memory of claim 1
    wherein the redundant reference element is coupled in parallel with the reference element.

3. The memory of claim 2 wherein the redundant reference element is physically positioned between the reference element and the redundant cell.

4. The memory of claim 2 wherein redundant reference element is physically positioned away from the reference element to reduce a probability of error resulting from wafer processing defects occurring in both the reference element and the redundant reference element.

5. The memory of claim 1 wherein:
    the memory cell has a dominant failure mode of remaining at a logic low when programmed to be a logic high; and
    the reference element has a dominant failure mode of having a higher resistance than desired.

6. The memory of claim 5 wherein:
    the redundant memory cell has a dominant failure mode of remaining at a logic low when programmed to be a logic high; and
    the redundant reference element has a dominant failure mode of having a higher resistance than desired.

7. The memory of claim 5 wherein the logic circuit of the memory is further characterized by the logic function being an OR function.

8. The memory of claim 1 wherein the logic function of the logic circuit depends upon a type of processing failure associated with the cell and the reference element.

9. The memory of claim 1 wherein the one or more cells of the reference element comprise one or more segment(s) of silicided polysilicon material.

10. The memory of claim 1 wherein the one or more cells of the reference element comprise one or more segment(s) of polysilicon material.

11. The memory of claim 1 wherein the memory cell comprises a resistive material, the resistive material being open-circuited when programmed and being conductive when not programmed.

12. A method of determining a bit logic state of a bit of a memory comprising:
   attempting to program a memory cell of the bit to store either a logic one or a logic zero value;
   providing a reference value from a reference element of the bit, the reference element of the first bit comprising one or more cells;
   attempting to program a redundant cell of the bit to store a same bit value as the cell of the first bit;
   providing a redundant reference value from a redundant reference element of the bit, the redundant reference element of the bit comprising one or more cells;
   sensing a cell logic state using the cell of the bit and the reference element of the bit;
   sensing a redundant cell logic state using the redundant cell of the bit and the redundant reference element;
   producing an output indicating the logic state of the bit in response to performing a logic operation on the combination of the cell logic state and the redundant cell logic state.

13. The method of claim 12 further comprising:
   placing the redundant reference element in parallel with the reference element.

14. The method of claim 12 wherein:
   the step of sensing the cell logic state is further characterized by coupling the cell of the bit and the reference element of the bit to a first sense amplifier associated with the first bit; and
   the step of sensing the redundant cell logic state is further characterized by coupling the redundant reference element and the redundant cell of the bit to a second sense amplifier associated with the bit.

15. The method of claim 12 further comprising: physically positioning the redundant reference element of the bit between the reference element of the bit and the redundant cell of the bit.

16. The method of claim 12 further comprising:
   physically positioning the redundant reference element away from the reference element.

17. A memory comprising:
   a cell associated with a first bit having a first terminal coupled to a voltage terminal, and having a second terminal;
   a reference element associated with both the first bit and a second bit having a first terminal coupled to the voltage terminal, and having a second terminal;
   a cell associated with the second bit having a first terminal coupled to the voltage terminal, and having a second terminal;
   a redundant cell associated with the first bit having a first terminal coupled to the voltage terminal, and having a second terminal;
   an additional reference element associated with both the first bit and the second bit having a first terminal coupled to the voltage terminal, and having a second terminal;
   a redundant cell associated with the second bit having a first terminal coupled to the voltage terminal, and having a second terminal;
   a first sense amplifier having a first input coupled to the second terminal of the cell associated with the first bit, a second input coupled to the second terminal of the reference element associated with the first bit and the second bit, and having an output;
   a second sense amplifier having a first input coupled to the second terminal of the reference element associated with both the first bit and the second bit, a second input coupled to the second terminal of the cell associated with the second bit, and an output;
   a third sense amplifier having a first input coupled to the second terminal of the redundant cell associated with the first bit, a second input coupled to the second terminal of the additional reference element associated with both the first bit and the second bit, and an output;
   a fourth sense amplifier having a first input coupled to the second terminal of the additional reference element associated with both the first bit and the second bit, a second input coupled to the redundant cell associated with the second bit, and an output; and
   logic circuitry coupled to the first sense amplifier, the second sense amplifier, the third sense amplifier and the fourth sense amplifier, the logic circuit performing a first logic operation of a first type on the outputs of the first and second sense amplifiers and performing a second logic operation of the first type on the outputs of the third and fourth sense amplifiers and providing outputs representative of the first and second logic operations as indicating whether the cell associated with the first bit and the cell associated with the second bit are programmed with either a logic one or a logic zero value.

18. The memory of claim 17 wherein the cell associated with the first bit, the redundant cell associated with the first bit, the cell associated with the second bit, and the redundant cell associated with the second bit each comprise a segment of silicided polysilicon material and the reference element associated with both the first bit and the second bit and the additional reference element associated with both the first bit and the second bit each comprise one or more segment(s) of silicided polysilicon material.

19. A memory comprising:
   a cell associated with a first bit having a first terminal coupled to a voltage terminal, and having a second terminal;
   a reference element associated with the first bit and having a first terminal coupled to the voltage terminal, and having a second terminal;
   an additional reference element associated with the first bit and having a first terminal coupled to the voltage terminal, and having a second terminal;
   a redundant cell having a first terminal coupled to the voltage terminal and a second terminal;
   a first sense amplifier having a first input coupled to the second terminal of the cell associated with the first bit, a second input coupled to both the second terminal of the reference element associated with the first bit and the second terminal of the additional reference element, and having an output;
   a second sense amplifier having a first input coupled to both the second terminal of the reference element associated with the first bit and the second terminal of the additional reference element, a second input coupled to the second terminal of the redundant cell, and an output; and
   logic circuitry coupled to the output of the first sense amplifier and the output of the second sense amplifier, the logic circuit performing a logic operation on the outputs of the first and second sense amplifiers and providing an output representative of the logic operation as indicating whether the cell associated with the first bit is programmed with either a logic one or a logic zero value.

20. The memory of claim 19 wherein the additional reference element is physically positioned away from the reference element to reduce a probability of error resulting from wafer processing defects occurring in both the reference element of the first bit and the additional reference element.

* * * * *